United States Patent
Shi et al.

[11] Patent Number: 5,886,464
[45] Date of Patent: Mar. 23, 1999

[54] ORGANIC ELECTROLUMINESCENT DEVICE WITH EMISSION FROM HOLE TRANSPORTING LAYER

[75] Inventors: Song Q. Shi, Phoenix, Ariz.;
Hsing-Chung Lee, Calabasas, Calif.;
Thomas B. Harvey, III, Scottsdale;
Franky So, Tempe, both of Ariz.

[73] Assignee: Motorola, Inc., Schaumburg, Ill.

[21] Appl. No.: 844,506

[22] Filed: Apr. 18, 1997

Related U.S. Application Data

[62] Division of Ser. No. 660,014, Jun. 6, 1996, Pat. No. 5,668,438.

[51] Int. Cl.$^6$ .............................. H01J 1/62; H01J 63/04; B05D 5/06; B05D 5/12
[52] U.S. Cl. .......................... 313/503; 313/504; 313/506; 427/66; 428/690; 252/582
[58] Field of Search .................... 427/66; 313/498, 313/504–7, 511–12; 428/690, 917; 252/582

[56] References Cited

U.S. PATENT DOCUMENTS

| | | | |
|---|---|---|---|
| 4,539,507 | 9/1985 | Von Slyke et al. ...................... | 313/504 |
| 4,769,292 | 9/1988 | Tang et al. .......................... | 313/504 X |
| 4,885,211 | 12/1989 | Tang et al. .......................... | 313/504 X |
| 4,950,950 | 8/1990 | Perry et al. .......................... | 313/504 X |
| 5,059,862 | 10/1991 | Von Slyke et a. .................. | 313/504 X |
| 5,061,569 | 10/1991 | Von Slyke et al. ................. | 313/504 X |
| 5,118,986 | 6/1992 | Ohnuma et al. .................... | 313/498 X |
| 5,405,709 | 4/1995 | Littman et al. ...................... | 313/504 X |
| 5,409,783 | 4/1995 | Tang et al. .......................... | 313/504 X |
| 5,486,406 | 1/1996 | Shi ...................................... | 313/504 X |
| 5,540,999 | 7/1996 | Yamamoto et al. ................. | 313/504 X |

*Primary Examiner*—Sandra O'Shea
*Assistant Examiner*—Mack Haynes
*Attorney, Agent, or Firm*—Eugene A. Parsons

[57] ABSTRACT

An organic EL device comprises a cathode, an electron transporting layer (ETL), a hole transporting layer (HTL) and an anode which are laminated in sequence, wherein the materials making up the ETL and HTL are so selected that the energy barrier for hole injection from the HTL to the ETL is substantially higher than the energy barrier for electron injection from the ETL to the HTL. The organic EL device obtained has efficient light emission from the HTL layer when an efficient fluorescent dye as an emitter is doped in the HTL or the part of the HTL close to the ETL/HTL interface.

5 Claims, 1 Drawing Sheet

ORGANIC ELECTROLUMINESCENT DEVICE WITH EMISSION FROM HOLE TRANSPORTING LAYER

This is a division of application Ser. No. 08/660,014, filed Jun. 6, 1996 now U.S. Pat. No. 5,668,438.

FIELD OF THE INVENTION

This invention relates to an organic electroluminescence (EL) device and particularly to the light emission layer of an organic EL device.

BACKGROUND OF THE INVENTION

Organic electroluminescent (EL) devices are generally composed of three layers of organic molecules sandwiched between transparent and metallic electrodes, the three layers include an electron transporting layer, an emissive layer and a hole transporting layer.

There are several variations in organic EL structures depending on where the emissive layer is positioned. Tsutsui and coworkers proposed three EL cell structures: SH-A, SH-B and DH (T. Tsutsui, et. al, Photochem. Processes Organ. Mol. Syst., Proc. Meml. Conf. Late Professor Shigeo Tazuke, 437–50 (1991)). The SH-A cell is successively composed of a layer of Mg—Ag as a cathode, an electron transporting layer (ETL), a hole transporting layer (HTL) and a layer of Indium-Tin-oxide (ITO) as an anode, wherein the light emission comes from the part of the electron transporting layer close to the hole transporting layer. The SH-B cell is also successively composed of Mg—Ag as a cathode, an electron transporting layer, a hole transporting layer and a layer of ITO as an anode, wherein the light emission comes from the part of the hole transporting layer close to the electron transporting layer. The DH cell is successively composed of Mg—Ag as a cathode, an electron transporting layer, an emitter layer, a hole transporting layer and a layer of ITO as an anode, wherein the emitter layer is an independent layer sandwiched between the electron transporting layer and the hole transporting layer.

Earlier, in U.S. Pat. No. 4,539,507 (entitled "Organic Electroluminescent Devices Having Improved Power Conversion Efficiencies", issued Sep. 3, 1985), VanSlyke and Tang also disclosed a SH-A type of organic EL device with a hole-injecting zone and an organic luminescent zone wherein the luminescent zone comprises an electron transporting compound, and has a quantum efficiency of at least 0.05% and a w/w efficiency of at least $9\times10^{-5}$, and a thickness of less then 1 $\mu$m.

Hamada and coworker in 1995 reported a modified SH-B type of organic EL cell (Y. Hamada et. al, Jpn. J. Appl. Phys. 34 (1995), L824–L826) with Rubrene as a dopant. The device has a luminance of 1020 cd/m² at a current density of 10 mA/cm² and a half lifetime of 3554 hours with initial luminance of 500 cd/m², which is a substantial improvement over any prior known SH-B type of cell.

The objective of the present invention is to provide an organic EL device of the SH-B type which has high efficiency and good reliability.

SUMMARY OF THE INVENTION

The above objective is realized in an organic EL device including a cathode and an anode with an electron transporting layer and a hole transporting layer positioned therebetween. The organic materials making up the electron and hole transporting layers are so selected that the energy barrier for hole injection from the hole transporting layer to the electron transporting layer is substantially higher than the energy barrier for electron injection from the electron transporting layer to the hole transporting layer.

Also, an organic EL device with efficient light emission from the hole transporting layer is obtained when an efficient fluorescent dye molecule as an emitter is doped in the hole transporting layer or part of the hole transporting layer close to the interface of the electron transporting layer and the hole transporting layer.

BRIEF DESCRIPTION OF THE DRAWINGS

The accompanying drawings, which are incorporated in and constitute a part of the specification, illustrate the preferred embodiments of the invention and, together with the detailed description of the preferred embodiments given below, serve to explain the principles of the invention.

DESCRIPTION OF THE PREFERRED EMBODIMENTS

The present invention is directed to an organic light emitting device which, in general, consists of thin layers of organic molecules sandwiched between transparent and metallic electrodes.

Figure 1:
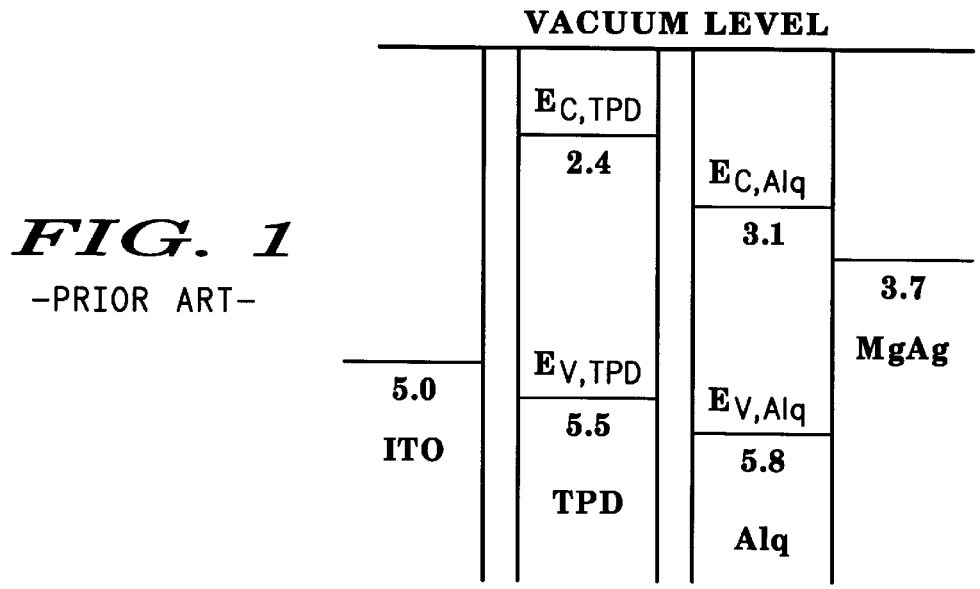
FIG. 1 is a schematic band diagram for all the layers constituting a typical organic EL device with cell structure of ITO//TPD//Alq//MgAg.

In the prior art, Aluminum tris(8-quinolinol) (Alq) has often been used in the electron transport layer as an electron transporting material, while an aromatic diamine such as N,N'-diphenyl-N,N'-bis(3-methylphenyl)-[1,1'-biphenyl]-4, 4'-diamine (TPD) has often been used in the hole transport layer as a hole transporting material. A schematic band diagram for all the layers constituting a typical organic EL device in the prior art is shown in FIG. 1. The energy barrier for electron injection from the conduction band of Alq ($E_{c,Alq}$) to the conduction band of TPD ($E_{C,TPD}$) is about 0.7 eV, while the energy barrier for hole injection from the valence band of TPD ($E_{V,TPD}$) to the valence band of Alq ($E_{V,Alq}$) is about 0.3 eV. Therefore, holes are more easily injected into the Alq layer, and electrons are more likely accumulated in the part of the Alq layer close to the Alq/TPD interface. Consequently, the emission occurs in the part of the Alq layer close to the Alq/TPD interface where electrons and holes recombine.

In a SH-A type of organic EL device, the Alq layer is doped with a fluorescent dye in the part of the layer close to the Alq/TPD interface where recombination usually occurs. An SH-B type of organic EL device, is doped with a fluorescent dye in the part of the TPD layer close to the Alq/TPD interface. The SH-A type of organic EL device is generally more efficient than the corresponding SH-B type of organic EL device. In fact, presently all of the organic EL devices that have both efficiency and reliability good enough to be useful for practical backlight or display applications have the SH-A type of cell structure.

Figure 2:
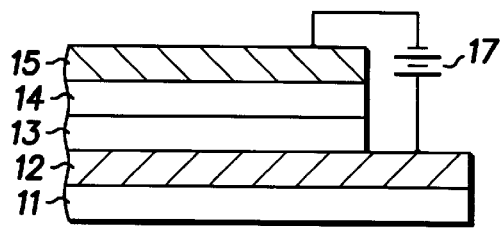
FIG. 2 is a simplified sectional view of an organic electroluminescence device in accordance with the present invention.

Turning now to FIG. 2 a simplified cross-sectional view is illustrated, of one embodiment of an organic EL device 10 in accordance with the present invention. Organic EL device 10 includes a transparent substrate 11 which in this specific embodiment is a glass or plastic plate having a relatively planar upper surface. A transparent electrically conductive layer 12 is deposited on the planar surface of substrate 11 so as to form a relatively uniform electrical contact. A hole transporting layer 13 made of organic hole transporting materials is deposited on the surface of conductive layer 12. Then an electron transporting layer 14 made of an electron transporting material is deposited on the surface of layer 13 and a second electrically conductive layer 15 is deposited on the upper surface of layer 14 to form a second electrical contact.

In this embodiment, conductive layer 15 is formed of any of a wide range of metals or alloys in which at least one metal has a work function less than 4.0 eV. By the proper selection of material for conductive layer 15, the work functions of the materials making up layers 14 and 15 are substantially matched to reduce the required operating voltage and improve the efficiency of organic EL device 10. Additional information on work function matching is disclosed in a copending U.S. patent application entitled "Organic LED with Improved Efficiency", filed 12 Sep. 1994, bearing Ser. No. 08/304,454, and assigned to the same assignee.

In this embodiment conductive layer 12 is a p-type contact and conductive layer 15 is an n-type contact. The negative terminal of a potential source 17 is connected to conductive layer 15 and the positive terminal is connected to conductive layer 12. When a potential is applied between layers 12 and 15 by means of potential source 17, electrons injected from the n-type contact (layer 15) are transported through organic layer 14 and into layer 13 and holes injected from the p-type contact (layer 12) are injected into organic layer 13, where upon electron and hole recombination a photon is emitted.

Figure 3:
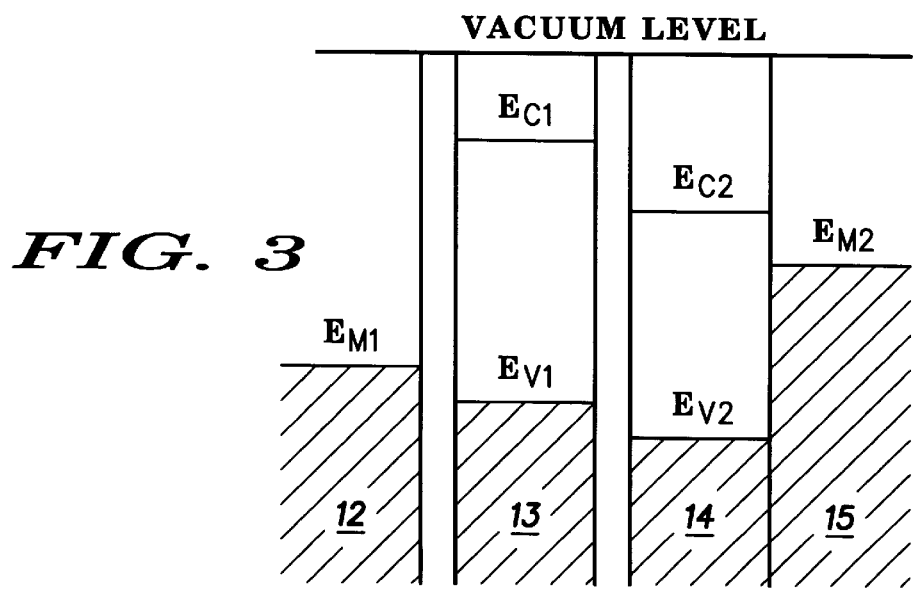
FIG. 3 is a band diagram in which the layers constituting the EL device of FIG. 2 are illustrated independently of each other.

FIG. 3 is a band diagram in which the layers constituting organic EL device 10 in accordance with the present invention are illustrated independently of each other. Assuming that the work function of transparent conductive electrode 12 is $E_{M1}$, the work function of metallic electrode 15 is $E_{M2}$, the conduction band level, and the valence band level of hole transporting layer 13 are $E_{C1}$ and $E_{V2}$, respectively, the conduction band level and the valence band level of electron transporting layer 14 are $E_{C2}$ and $E_{V2}$, respectively, the materials making up hole transporting layer 13 and electron transporting layer 14 are so selected as to satisfy the following inequality:

$$(E_{C1}-E_{C2})<(E_{V1}-E_{V2})$$

The inequality ensures that the energy barrier for holes to be injected into the valence band of electron transporting layer 14 from the valence band of hole transporting layer 13 is greater than that for electrons to be injected into the conduction band of the hole transporting layer 13 from the conduction band of electron transporting layer 14. Under forward bias, that is, a positive bias is applied to conductive layer 15 and a negative bias is applied to conductive layer 12, holes at $E_{M1}$ are injected into the valence band lever $E_{V1}$ of hole transporting layer 13; electrons at $E_{M2}$ are injected into the conduction band level $E_{C2}$ of electron transporting layer 14. Since $(E_{C1}-E_{C2})<(E_{V1}-E_{V2})$, electron injection from electron transporting layer 14 to hole transporting layer 13 is easier than hole injection from hole transporting layer 13 to electron transporting layer 14. Thus more electrons get injected into $E_{C1}$ of hole transporting layer 13 and more holes get accumulated in hole transporting layer 13 near the interface close to electron transporting layer 14. The net result is that electrons and holes recombine in the part of hole transporting layer 13 close to the interface of electron transporting layer 14 and hole transporting layer 13, where light emission occurs.

Generally the bigger the difference between the value of $(E_{V1}-E_{V2})$ and the value of $(E_{C1}-E_{C2})$, the more efficient the resulting organic EL device 10 will be. In this specific embodiment, it is preferred that the difference is at least 0.2 eV, that is, $$(E_{V1}-E_{V2})-(E_{C1}-E_{C2})>0.2\ eV$$

This limitation ensures that the emission will take place in hole transporting layer 13 of organic EL device 10.

In another embodiment of the invention, a fluorescent dye material capable of emitting light in response to hole-electron recombination is incorporated in hole transporting layer 13 or in the part of hole transporting layer 13 close to the interface between hole transporting layer 13 and electron transporting layer 14. The fluorescent dye molecule has a bandgap no greater than that of the material making up hole transporting layer 13. It is preferred that the fluorescent dye molecule is present in a concentration of from $10^{-3}$ to 10 mole percent, based on the moles of the material comprised of hole transporting layer 13.

In the practice of the present invention, it is crucial to match the energy band level requirement for the materials making up layers 13 and 14 in organic EL device 10 so as to achieve an efficient organic EL device with emission from hole transporting layer 13. Generally speaking, the bandgap of the material making up hole transporting layer 13 has to be no greater than that of the material making up electron transporting layer 14. For example, in accordance with the invention, a green fluorescent hole transporting material of typical band gap of 2.50 eV has to be matched with a blue fluorescent electron transporting material of typical bandgap of 2.75 eV.

One class of the preferred electron transporting materials are the organometallic complexes disclosed in a pending U.S. patent application entitled "NEW ORGANOMETALLIC COMPLEXES FOR USE IN LIGHT EMITTING DEVICES", filed 12 Sep. 1994, bearing Ser. No. 08/304,451, and assigned to the same assignee, having one of the following general formulas

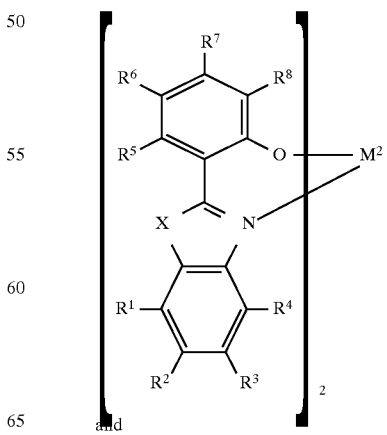

and

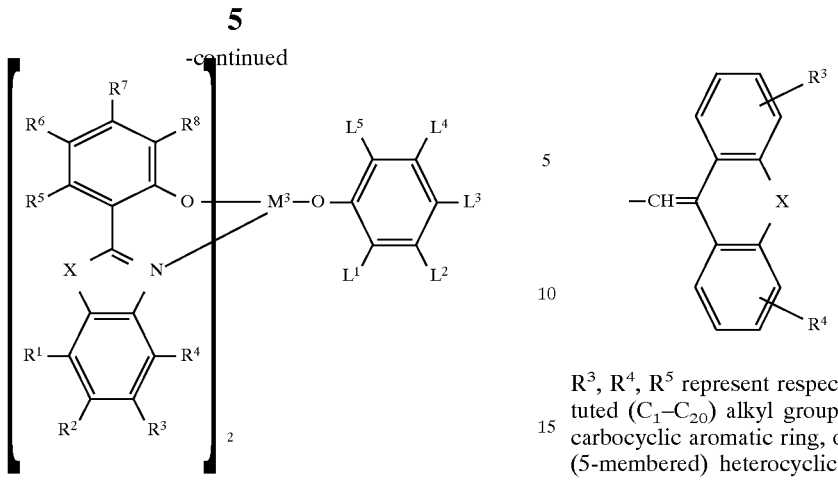

where $M^2$ is a divalent metal; $M^3$ is a trivalent metal; X represents one of O, S, NH and $CH_2$; R1 to R8 represent substitution possibilities at each position and each represent hydrogen or hydrocarbon groups or functional groups; and L1 to L5 represent substitution possibilities at each position and each represent hydrogen or hydrocarbon groups or functional groups such as cyano, halogen, haloalkyl, haloalkoxy, alkoxyl, amido, amino, sulfonyl, carbonyl, carbonyloxy and oxycarbonyl;

Another class of blue emitting materials disclosed by Vanslyke et al in U.S. Pat. No. 5,150,006 can also be selected as an electron transporting material in accordance with the present invention. This class of materials have a general formula of:

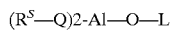

$(R^S-Q)2-Al-O-L$ where Q in each occurrence represents a substituted 8-quinolinolato ligand; $R^S$ represents an 8-quinolinolato ring substituent chosen to block sterically the attachment of more than two substituted 8-quinolinolato ligands to the aluminum atom; O—L is phenolato ligand and L is a hydrocarbon of from 6 to 24 carbon atoms comprised of a phenyl moiety.

Among the hole transporting materials suitable for use to match the above mentioned electron transporting materials are those disclosed in U. S. Pat. No. 5,093,210 (entitled "Electroluminescent Device", issued Mar. 3, 1992), having a general formula of:

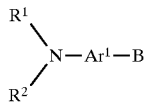

wherein $R^1$ and $R^2$ each independently represents a substituted or unsubstituted ($C_1$–$C_{20}$) alkyl group, a substituted or unsubstituted carbocyclic aromatic ring, or a substituted or unsubstituted (5-membered) heterocyclic aromatic ring, or $R^1$ and $R^2$ together form a 5–15 membered ring; $Ar^1$ represents a substituted or unsubstituted carbocyclic aromatic ring, or a substituted or unsubstituted (5–13 membered) heterocyclic aromatic ring; B represents $-(CH=CH)_n Ar^2$ or $R^3$, $R^4$, $R^5$ represent respectively a substituted or unsubstituted ($C_1$–$C_{20}$) alkyl group, a substituted or unsubstituted carbocyclic aromatic ring, or a substituted or unsubstituted (5-membered) heterocyclic aromatic ring, or R1 and R2 together form a 5–15 membered ring; $Ar^2$ represents a substituted or unsubstituted carbocyclic aromatic ring, or a substituted or unsubstituted (5–13 membered) heterocyclic aromatic ring, and n represents an integer of 1,2 or 3)

In one variation of the embodiment, a thin layer, preferably less than 500 Å thick, of hole injecting material (not shown) can be inserted between conductive layer 12 (anode) and hole transporting layer 13 to enhance the hole injection from the anode in organic EL device 10. Also, any porphyrinic compounds disclosed in U.S. Pat. No. 3,935,031 (entitled "Photovoltaic Cell with Enhanced Power Output", issued Jan. 27, 1976) or U.S. Pat. No. 4,356,429 (entitled "Organic Electroluminescent Cell", issued Oct. 26, 1982) can be employed as the hole injecting layer.

In another variation of the embodiment, a thin layer, preferably less than 150 Å thick, of electron injecting material (not shown) can be inserted between electron transporting layer 14 and conductive layer 15 to promote electron injection from the cathode in organic EL device 10. The metal complexes of 8-hydroxyquinoline disclosed in U.S. Pat. No. 4,539,507 can also be used as the electron injecting layer.

Thus, an organic EL device of the SH-B type is disclosed which has high efficiency relative to prior art SH-B type devices and which has good reliability.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating an organic electroluminescent device comprising the steps of:

forming an anode;

supporting an organic hole transporting layer on the anode and an organic electron transporting layer on the hole transporting layer, the materials for the hole and electron transporting layers being such that the following inequality holds:

$(E_{C1}-E_{C2}) < (E_{V1}-E_{V2})$ where $E_{C1}$ and $E_{V1}$ respectively represent a conduction band level, and a valence band level of the material selected for the hole transporting layer; and $E_{C2}$ and $E_{V2}$ respectively represent a conduction band level and a valence band level of the material selected for the electron transporting layer; and supporting a cathode on the electron transporting layer.

2. A method of fabricating an organic electroluminescent device as claimed in claim 1 including in addition a step of locating fluorescent dye material capable of emitting light in response to hole-electron recombinations in the hole transporting layer or in a part of the hole transporting layer close to an interface of transporting and electron transporting layers.

3. A method of fabricating an organic electroluminescent device as claimed in claim 1 wherein the step of selecting materials for the hole and electron transporting layers includes selecting the materials for the hole and electron transporting layers such that the material making up the hole transporting layer has a bandgap which is no greater than a bandgap of the material making up the electron transporting layer.

4. A method of fabricating an organic electroluminescent device as claimed in claim 1 including in addition a step of positioning an electron injection layer between the cathode and the electron transporting layer.

5. A method of fabricating an organic electroluminescent device as claimed in claim 1 including in addition a step of positioning a hole injection layer between the anode and the hole transporting layer.

* * * * *